(12) United States Patent
Smith

(10) Patent No.: US 9,128,157 B2
(45) Date of Patent: Sep. 8, 2015

(54) SURFACE SCANNING RADIO FREQUENCY ANTENNA FOR MAGNETIC RESONANCE FORCE MICROSCOPY

(75) Inventor: Doran Smith, Rockville, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 747 days.

(21) Appl. No.: 13/361,056

(22) Filed: Jan. 30, 2012

(65) Prior Publication Data

US 2013/0193963 A1    Aug. 1, 2013

(51) Int. Cl.
*G01V 3/00* (2006.01)
*G01R 33/341* (2006.01)
*G01Q 60/52* (2010.01)
*G01R 33/32* (2006.01)

(52) U.S. Cl.
CPC .............. *G01R 33/341* (2013.01); *G01Q 60/52* (2013.01); *G01R 33/323* (2013.01)

(58) Field of Classification Search
CPC ...................................................... G01Q 60/52
USPC .................. 324/318, 321, 322, 300
See application file for complete search history.

(56) References Cited

U.S. PATENT DOCUMENTS 6,181,131 B1 *   1/2001   Bruland et al. ............... 324/300
2013/0193970 A1 *   8/2013   Alexson et al. ............... 324/309

OTHER PUBLICATIONS

"An Optimal Magnetic Tip Configuration for Magnetic-Resonance Force Microscopy of Microscale Buned Features", John A. Marohn and Raul Fainchtein, John Hopkins University, Applied Physics Laboratory. Laurel MD, and Doran D. Smith, U S. Army Research Laboratories, Adelphia, MD, vol. 73, No. 25, Dec. 21, 1998, pp. 3778-3780.
"Detailed Description of a Compact Cryogenic Magnetic Resonance Force Microscope", Doran D. Smith and John A. Marohn. U.S. Army Research Laboratory, Adelphi, MD and Center for Superconductivity Research, Department of Physics, University of Maryland, College Park, MD, and Lee E. Harrell, Department of Physics, United States Military Academy, West Point, NY, vol. 72, No. 4 Apr. 2001, pp. 2080-2089.

* cited by examiner

*Primary Examiner* — Louis Arana
(74) *Attorney, Agent, or Firm* — Alan I. Kalb

(57) ABSTRACT

A probe for scanning a surface of an arbitrarily sized sample in magnetic resonance force microscopy comprising a magnetic sensor having a support element coupled to a magnetic particle, an RF antenna, at least partially circumscribing the magnetic sensor, for emitting an RF magnetic field across a portion of the sample and an optical sensor, positioned proximate the magnetic sensor, for detecting displacement of the support element.

20 Claims, 5 Drawing Sheets

US 9,128,157 B2

SURFACE SCANNING RADIO FREQUENCY ANTENNA FOR MAGNETIC RESONANCE FORCE MICROSCOPY

GOVERNMENT INTEREST

The invention described herein may be manufactured, used and licensed by or for the U.S. Government.

FIELD OF INVENTION

Embodiments of the present invention generally relate to magnetic imaging and, more particularly, to a surface scanning radio frequency antenna for magnetic resonance force microscopy.

BACKGROUND OF THE INVENTION

Magnetic resonance force microscopy (MRFM) is an imaging technique that acquires magnetic resonance images (MRI) at nanometer scales, and possibly at atomic scales in the future. An MRFM system comprises a probe, method of applying a background magnetic field, electronics, and optics. The system measures variations in the resonant frequency of a cantilever or variations in the amplitude of an oscillating cantilever. The changes in the characteristic of the cantilever being monitored are indicative of the tomography of the sample. More specifically, as depicted in FIG. 1, an MRFM probe 100 comprises a base 102 with a cantilever 104 tipped with a magnetic (for example, Samarium cobalt) particle 106 to resonate as the spin of the electrons or nuclei in the sample 101 are reversed. There is a background magnetic field 108 generated by a background magnetic field generator 110 which creates a uniform background magnetic field in the sample 101. As the magnetic tip 106 moves close to the sample 101, the atoms' electrons or nuclear spins become attracted (force detection) to the tip and generate a small force on the cantilever 104. Using a radio frequency (RF) magnetic field applied by an RF antenna/wire coil 117 through the RF source 105, the spins are then repeatedly flipped at the cantilever's resonant frequency, causing the cantilever 104 to oscillate at its resonant frequency. In the geometry shown, springiness preservation by aligning magnetization (SPAM), when the cantilever 104 oscillates, the magnetic particle's 106 magnetic moment remains parallel to the background magnetic field 108, and thus it experiences no torque. The displacement of the cantilever is measured with an optical sensor 114 comprised of an interferometer (laser beam) 116 and an optical fiber 118 to create a series of 2-D images of the sample 101 held by sample stage 120, which are combined to generate a 3-D image. The interferometer measures the time dependent displacement of the cantilever 104. Smaller ferromagnetic particles and softer cantilevers increase the signal to noise ratio of the sensor. Current magnetic resonance force microscopy probes are limited to small samples due to probe geometries, where the radio frequency (RF) magnetic field is applied by a wire coil 117 positioned at an edge 120 of the sample 101. Because the wire coil 117 must be positioned at the edge 120 of the sample 101, the probe can only measure the topography near the edge or on a small sample.

Therefore, there is a need in the art for probe for magnetic resonance force microscopy in a more flexible manner for scanning arbitrarily large samples not limited to the edge of samples.

BRIEF SUMMARY OF THE INVENTION

Embodiments of the present invention relate to a probe for scanning a surface of an arbitrarily sized sample in magnetic resonance force microscopy comprising a magnetic sensor having a support element coupled to a magnetic particle; an RF antenna, at least partially circumscribing the magnetic sensor, for emitting an RF magnetic field across a portion of the sample; and an optical sensor, positioned proximate the magnetic sensor, for detecting displacement of the support element.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the present invention comprise a probe for use in magnetic resonance force microscopy (MRFM). Embodiments of the probe may be used in an MRFM technique known as Springiness Preservation by Aligning Magnetization (SPAM). By adopting the SPAM geometry and using a new probe geometry, accurate scanning of arbitrarily sized samples is achieved, not limited to scanning the edges of a sample.

Figure 1:
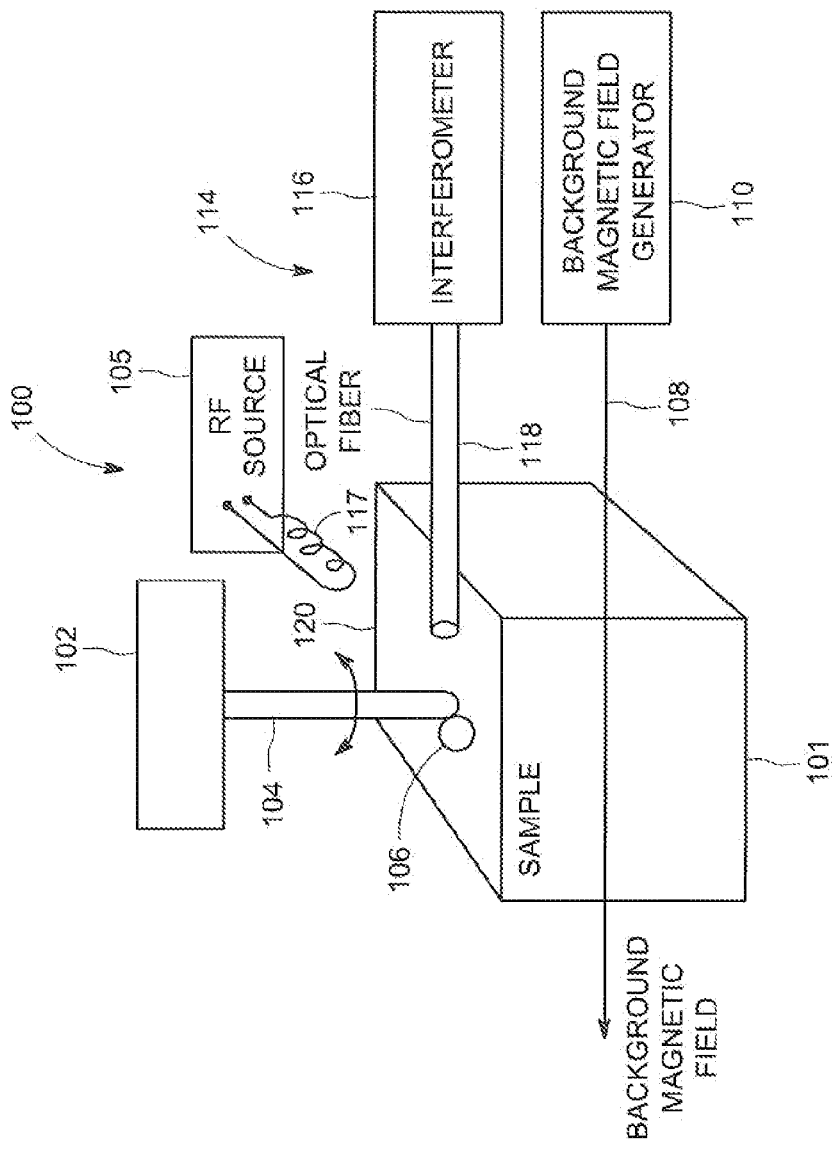
FIG. 1 depicts a conventional MRFM system known to those of ordinary skill in the art.
Figure 2:
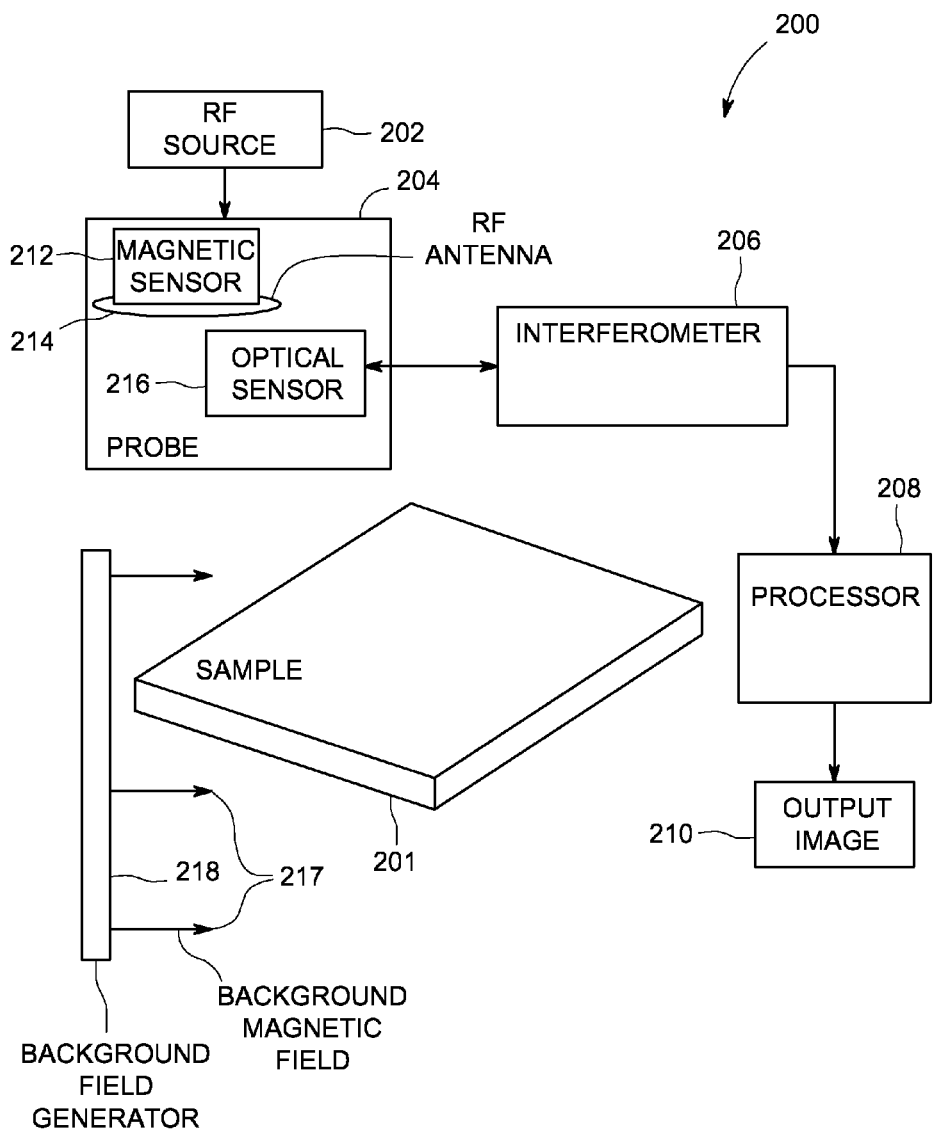
FIG. 2 depicts a block diagram of an MRFM system in accordance with an exemplary embodiment of the present invention.

FIG. 2 depicts a block diagram of an MRFM system 200 in accordance with an exemplary embodiment of the present invention. The system 200 generally has an RF source 202 coupled to a probe 204. The probe 204 is coupled to an interferometer 206 for performing optical measurements using the optical sensor 216 in the probe 204 of sample 201. The interferometer 206 transmits the measurements to a processor 208. The processor 208 generates an output image 210 based on the measurements or oscillations of portions of the probe 204. The probe 204 comprises a magnetic sensor 212, an RF antenna 214 and an optical sensor 216. The apparatus 200 is kept in a spatially homogeneous background magnetic field 217 (approximately 9 T) generated by a background magnetic field generator 218. In an exemplary embodiment, the background magnetic field, generator 218 comprises two one inch diameter Samarium Cobalt (SmCo) magnets. In an exemplary embodiment, the magnetic sensor 212 is comprised of a bridge coupled with a smaller SmCo particle (for example, 10 µm in diameter) which generates a spatially inhomogeneous field. The magnetic field experienced at a particular point in the sample 201 is the sum of the background magnetic field and the magnetic field generated by the magnetic sensor 212. The RF antenna 214 at least partially circumscribes the magnetic sensor 212. The RF antenna 214 generates an RF magnetic field which causes the spin in the particles of the sample 201 to reverse and oppose the SmCo particle on the bridge of the magnetic sensor 212. This repeated reversal of the spin of the particles in sample 201 causes the magnetic sensor 212 to oscillate at a particular frequency. The interferometer 206 senses oscillation of the magnetic sensor 212 using optical sensor 216 by using optical fiber 217 to reflect a laser off of the magnetic sensor 212. In another exemplary embodiment, the sample 201 is directly coupled to the bridge comprising the magnetic sensor 212 and a magnetic particle array of SmCo particles is proximate the magnetic sensor 212. According to an exemplary embodiment, the optical fiber 118 is 125 microns in diameter and is within approximately 1/10 of a millimeter of the magnetic sensor 212. In an exemplary embodiment, the optical sensor 216 is an optical fiber approximately twenty five times greater in diameter than the width of the bridge of the magnetic sensor 212. The gap between the optical fiber and the magnetic sensor 212 is fixed at a particular distance in this embodiment.

Figure 3:
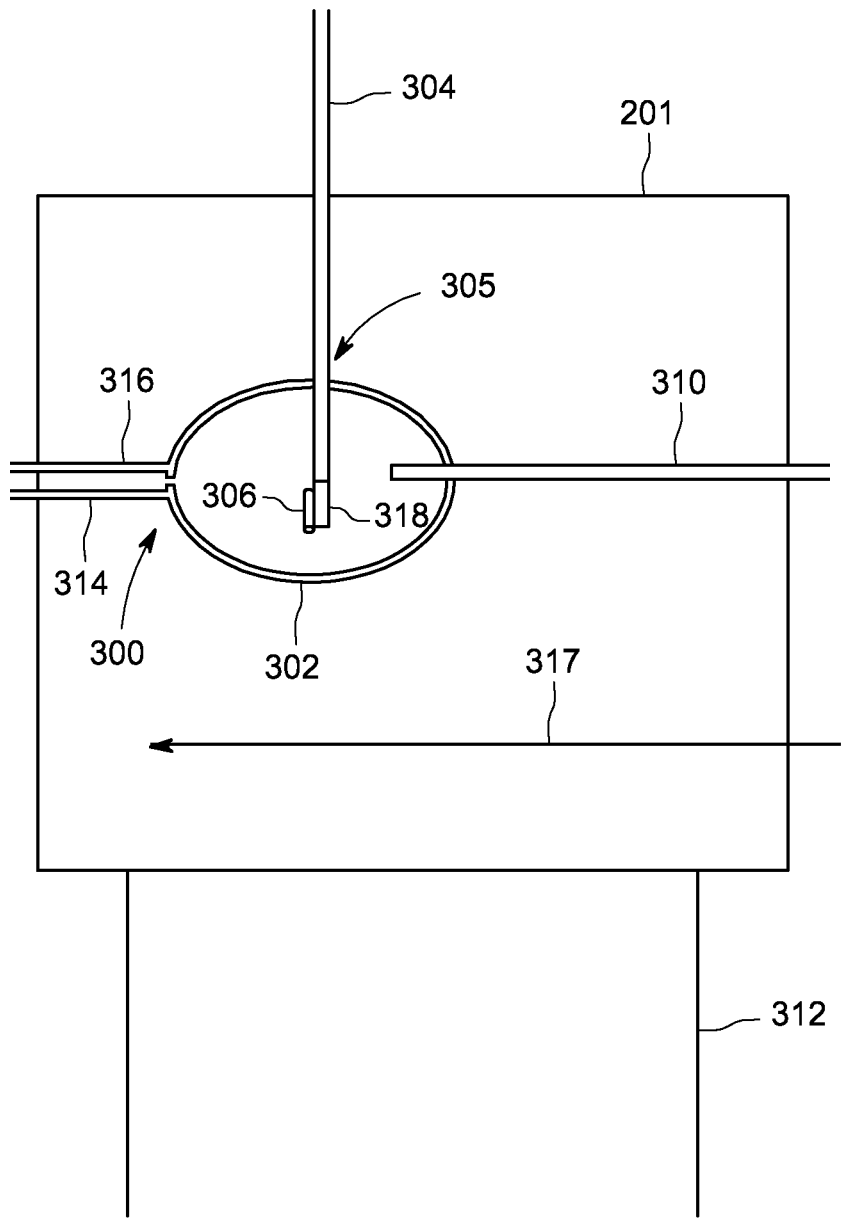
FIG. 3 is an illustration depicting a probe in accordance with an exemplary embodiment of the present invention.

FIG. 3 is an illustration depicting a probe 300 in accordance with an exemplary embodiment of the present invention. The probe 300 comprises an RF antenna 302 formed as a circular wire circumscribing a magnetic sensor 305. The magnetic sensor 105 comprises a support element 304 and a magnetic particle 306 at its tip 318. The support element 304 may be a bridge, cantilever, or other structure that resonates. A cantilever is shown with, in an exemplary embodiment, an approximately 100 μN/m (micro-Newtons per meter) spring constant, a mechanical Q of about 10,000-100,000 and a resonance frequency of about 1000 Hz. In this exemplary embodiment, the cantilever is made of silicon using a microelectromechanical systems (MEMS) fabrication process. The RF antenna 302 is positioned above sample 201, by, for example, a distance of 0.5 μm. Above the sample 308, the optical sensor 310 emits light onto the support element 304, which oscillates in the field perpendicular to the background magnetic field 317, generated by the background magnetic field generator 218 shown in FIG. 2. The RF antenna 302 creates an RF signal that permeates the sample 201, altering the spin of particles in the sample 201. The spin changes alternatively oppose and attract the particle 306 causing the magnetic sensor 305 to resonate by displacing the support element 304. In an exemplary embodiment, the RF antenna 302 generates an RF signal of 50 MHz to 380 MHz. The displacement of the support element 304 is measured by the optical sensor 310. The sample 108 is positionable with respect to the alignments of the RF antenna 102, the support element 304 and the optical fiber 310, by the use of a sample stage 312, as described in commonly assigned U.S. Patent Application Ser. No. 13/361,223, hereby incorporated by reference. The RF antenna 302, the support element 304 and the optical fiber 310 are positioned statically with respect to each other. The RF antenna 302 is closer to the sample 201 than it would be in otherwise different geometries because it is not constrained to the edge of the geometry; causing a larger RF magnetic field to radiate through the sample 201.

The RF antenna 302 produces both RF magnetic field and RF electric fields. Typically, MRFM uses the RF magnetic field to oscillate the spin of atoms in the sample. The RF electric field is undesired in MRFM because it causes transients in the magnetic sensor 305 oscillation frequency and/or the position of the support element 304. The RF electric field along the axis of an ideal loop antenna is zero. The support element 304 and the magnetic particle 306 are then located in a much stronger RF magnetic field than in conventional MRFM systems. In an exemplary embodiment the RF antenna 302, the antenna has a nearly circular shape with a small gap at which the input lead 314 and the output lead 316 extend outwards on the same plane. In other embodiments, the leads 314 and 316 extend downward or in another direction. In yet another embodiment, the RF antenna 302 does not have extended leads, but receives RF power through an inductive coupling to another segment of nearby wire (not shown).

Figure 4:
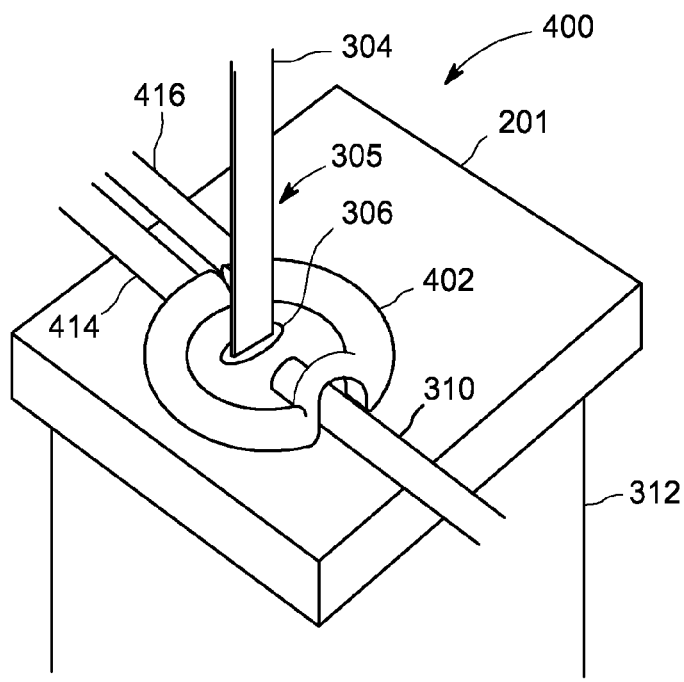
FIG. 4 is a three-quarters view of a modified probe in accordance with an exemplary embodiment of the present invention.

FIG. 4 is a three-quarters view of a modified probe 400 in accordance with an exemplary embodiment of the present invention. In exemplary embodiments, the RF antenna 402 is thicker than that shown in FIG. 3, and may not fit under the optical fiber 310 without touching the sample 201. In this embodiment, the RF antenna 402 is formed as a coil that is looped up and over the optical fiber 310 and the leads 414 and 416 lead to an RF source. The loop 403 causes a small distortion in the magnetic field created in the area of the sample directly underneath the antenna 402 and is accounted for during measurement processing.

Figure 5:
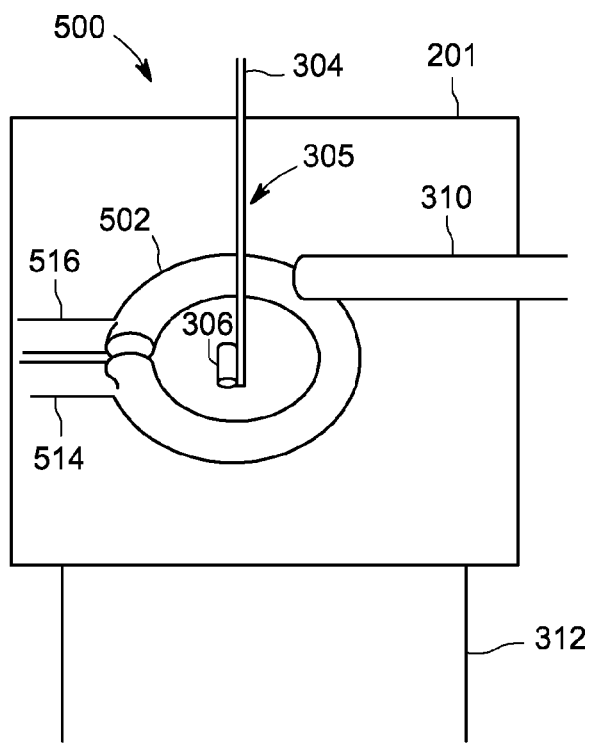
FIG. 5 is an illustration of a modified probe in accordance with another exemplary embodiment of the present invention.

FIG. 5 is an illustration of a modified probe 500 in accordance with another exemplary embodiment of the present invention. In this geometry, the RF antenna 502, with leads 514 and 516, does not have a loop 403 as shown in FIG. 4, but the RF antenna 502 is also shown in a thicker embodiment where the optical fiber 310 will not fit underneath without touching the sample 168. Therefore, in this embodiment, the optical fiber 310 is raised above the RF antenna 502, avoiding any distortions created in the magnetic field by using a non-uniform antenna structure. In another embodiment, the optical fiber 310 is in the plane of the antenna, located between the leads 314 and 316.

Figure 6:
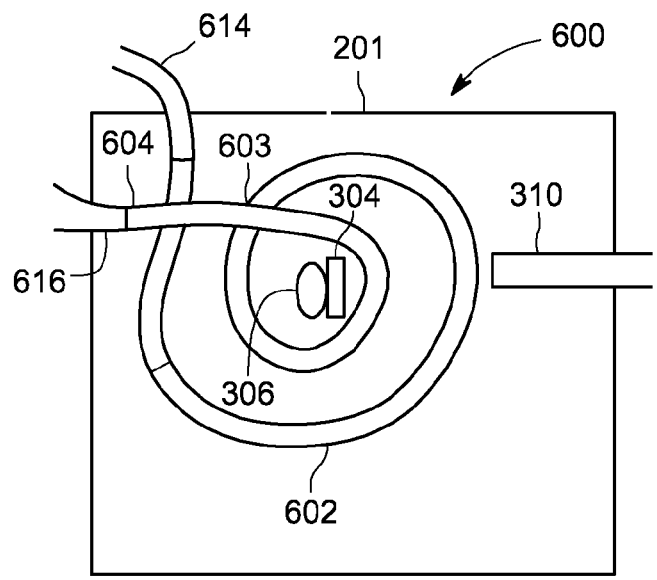
FIG. 6 is a top-down illustration of a modified probe in accordance with another exemplary embodiment of the present invention.

FIG. 6 is a top-down illustration of a modified probe 600 in accordance with another exemplary embodiment of the present invention. In this embodiment, RF antenna 602, with leads 614 and 616, is coiled over itself and around the magnetic sensor 305. In an exemplary embodiment, the upper coil of RF antenna 602 is raised at section 603 above the lower coil of RF antenna 602 and lowered at section 604. In other embodiments, one portion of the RF antenna 602 is lowered at section 603 underneath the other portion and raised again at section 604. The coiling of RF antenna 602 (e.g., using more than one turn of the coil) increases the magnetic field in the sample 201 and allows for better inversion of spin of the particles in the sample 201. The coiling of RF antenna 602 results in a more accurate MRFM image of the structure of the sample 201. Optionally, the fiber 310 can be located above, below or between the coils.

Figure 7:
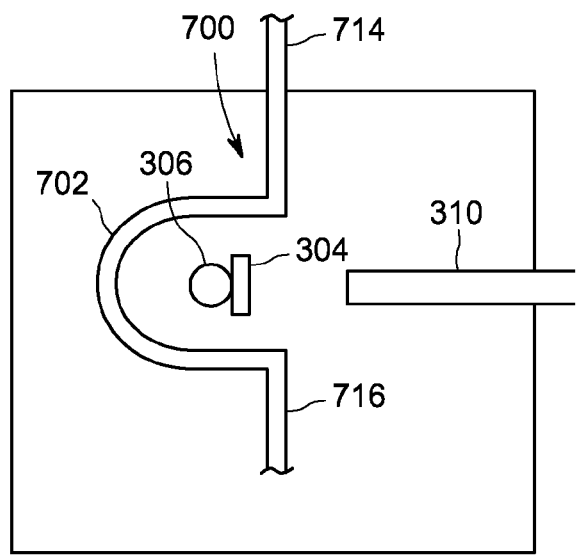
FIG. 7 is a top-down, illustration of a modified probe in accordance with another exemplary embodiment of the present invention.

FIG. 7 is a top-down illustration of a modified probe 700 in accordance with another exemplary embodiment of the present invention. Sample 201 is placed below RF antenna 702, with leads 714 and 716, where the support element 304 tipped with a magnetic particle 306 is placed in the RF magnetic, field of the RF antenna 702 and the optical fiber 310 detects small displacements in the support element 304. In this embodiment, the RF antenna 702 is in a horseshoe shape. In this configuration, the optical fiber is avoided completely due to the shape of the antenna. The RF antenna 702 also avoids the problem of creating a distorted magnetic field in the sample 201 by doubling over itself or creating a loop over the optical fiber 310 as in other geometries.

In any of the foregoing embodiments, the sample and the magnetic particle can be swapped, such that the sample is coupled to the cantilever and the magnetic particle is replaced with a single particle or an array of magnetic particles secured to a moveable stage.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Various elements, devices, modules and circuits are described above in associated with their respective functions. These elements, devices, modules and circuits are considered means for performing their respective functions as described herein. While the foregoing is directed to embodiments of the present invention, other and further embodiments of the invention may be devised without departing from the basic scope thereof, and the scope thereof is determined by the claims that follow.

The invention claimed is:

1. A probe for scanning a surface of an arbitrarily sized sample in magnetic resonance force microscopy comprising:
    a magnetic sensor having a support element coupled to a magnetic particle;
    an RF antenna, at least partially circumscribing the magnetic sensor, for emitting an RF magnetic field across a portion of the sample; and
    an optical sensor, positioned proximate the magnetic sensor, for detecting displacement of the support element.

2. The probe of claim 1 wherein the RF antenna forms a nearly closed loop of wire circumscribing the magnetic sensor.

3. The probe of claim 1 wherein the RF antenna forms one or more coils over itself circumscribing the magnetic sensor.

4. The probe of claim 1 wherein the optical sensor is located below or above the RF antenna.

5. The probe of claim 2 wherein the RF antenna contains a raised semi-circle loop for accommodating the optical sensor on the same plane as the portion of the RF antenna which is not raised.

6. The probe of claim 1 wherein the RF antenna forms a semi-circle around the magnetic sensor for allowing the optical sensor to be positioned on the same plane as the RF antenna.

7. The probe of claim 1 wherein the RF antenna has a round cross-section.

8. The probe of claim 1 wherein the RF antenna has a cross-section with four or more sides.

9. The probe of claim 1 wherein the support element is coupled to the sample instead of the magnetic particle and the probe further comprises one or more magnetic particles.

10. The probe of claim 1 wherein the magnetic sensor is a resonant moveable element with the magnetic particle coupled to a tip of the resonant moveable element.

11. The probe of claim 10 wherein the magnetic particle is one of a ferro-magnetic, para-magnetic, or superpara-magnetic particle.

12. The probe of claim 10 wherein the resonant moveable element is a bridge or cantilever.

13. A system for magnetic resonance force microscopy comprising:
    a probe for scanning a surface of an arbitrarily sized sample comprising:
        a magnetic sensor having a support element coupled to a magnetic particle;
        an RF antenna, at least partially circumscribing the magnetic sensor, for emitting an RF magnetic field across a portion of the sample; and
        an optical sensor, positioned proximate the magnetic sensor, for detecting displacement of the support element;
    an interferometer for measuring small displacements in the magnetic sensor;
    an RF source for pulsing RF signals through the sample; and
    a magnetic field source for generating a background magnetic field for the probe.

14. The system of claim 13 wherein the RF antenna forms a nearly closed loop of wire circumscribing the magnetic sensor.

15. The system of claim 13 wherein the RF antenna forms one or more coils over itself circumscribing the magnetic sensor.

16. The system of claim 13 wherein the optical sensor is located below or above the RF antenna.

17. The system of claim 14 wherein the RF antenna contains a raised semi-circle loop for accommodating the optical sensor on the same plane as the portion of the RF antenna which is not raised.

18. The system of claim 13 wherein the RF antenna forms a semi-circle around the magnetic sensor for allowing the optical sensor to be positioned on the same plane as the RF antenna.

19. The system of claim 13 wherein the support element is coupled to the sample instead of the magnetic particle and the probe further comprises one or more magnetic particles.

20. The system of claim 13 wherein the magnetic sensor is a resonant moveable element with one or more magnetic particle coupled to a tip of the resonant moveable element.

* * * * *